US010976375B2

(12) United States Patent
Jyumonji

(10) Patent No.: US 10,976,375 B2
(45) Date of Patent: Apr. 13, 2021

(54) ON-BOARD CONTROLLER

(71) Applicant: Hitachi Automotive Systems, Ltd., Hitachinaka (JP)

(72) Inventor: Kentarou Jyumonji, Hitachinaka (JP)

(73) Assignee: Hitachi Automotive Systems, Ltd., Hitachinaka (JP)

( * ) Notice: Subject to any disclaimer, the term of this patent is extended or adjusted under 35 U.S.C. 154(b) by 247 days.

(21) Appl. No.: 16/342,258

(22) PCT Filed: Nov. 2, 2017

(86) PCT No.: PCT/JP2017/039686
§ 371 (c)(1),
(2) Date: Apr. 16, 2019

(87) PCT Pub. No.: WO2018/110134
PCT Pub. Date: Jun. 21, 2018

(65) Prior Publication Data
US 2019/0326742 A1     Oct. 24, 2019

(30) Foreign Application Priority Data

Dec. 16, 2016 (JP) .............................. JP2016-244641

(51) Int. Cl.
H02H 1/04 (2006.01)
H02H 1/00 (2006.01)
(Continued)

(52) U.S. Cl.
CPC .............. *G01R 31/54* (2020.01); *B60R 16/02* (2013.01); *G01R 31/006* (2013.01);
(Continued)

(58) Field of Classification Search
CPC .......... H02H 1/04; H02H 1/0007; H02H 3/38; H02H 3/033; G01R 31/50; G01R 31/006; G01R 31/54; B60R 16/02
(Continued)

(56) References Cited

U.S. PATENT DOCUMENTS

2004/0004470 A1* 1/2004 Yoshida .............. H02M 3/1563
                                                       323/284
2013/0235505 A1* 9/2013 Takeshita ............... H01H 47/02
                                                       361/187
(Continued)

FOREIGN PATENT DOCUMENTS

JP         2015-77818 A    4/2015
JP         2016-141351 A   8/2016
(Continued)

OTHER PUBLICATIONS

International Search Report (PCT/ISA/210) issued in PCT Application No. PCT/JP2017/039686 dated Feb. 20, 2018 with English translation (four (4) pages).
(Continued)

*Primary Examiner* — Dharti H Patel
(74) *Attorney, Agent, or Firm* — Crowell & Moring LLP

(57) ABSTRACT

There is implemented an on-board controller including a single ground terminal, which can accurately detect a disconnection fault of a ground wire while avoiding erroneous detection due to a temporary voltage abnormality or current abnormality. A voltage at the positive electrode of a smoothing electrolytic capacitor is monitored. In addition, a current flowing through a shunt resistor is also monitored. Based on the monitored current value, there is calculated a voltage range (voltage threshold) at the positive electrode of the smoothing electrolytic capacitor in the case of disconnection of a ground wire. Thus, it is determined whether the ground wire has been disconnected by comparing the calculated (Continued)

voltage threshold with the monitored positive-side voltage described above.

9 Claims, 5 Drawing Sheets

(51) Int. Cl.
    *H02H 3/38*     (2006.01)
    *H02H 3/033*     (2006.01)
    *G01R 31/54*     (2020.01)
    *B60R 16/02*     (2006.01)
    *G01R 31/00*     (2006.01)

(52) U.S. Cl.
    CPC ............ *H02H 1/0007* (2013.01); *H02H 1/04* (2013.01); *H02H 3/38* (2013.01); *H02H 3/033* (2013.01)

(58) Field of Classification Search
    USPC .......................................................... 361/79
    See application file for complete search history.

(56) References Cited

U.S. PATENT DOCUMENTS

| | | | |
|---|---|---|---|
| 2014/0320098 A1* | 10/2014 | Izumoto | H02M 3/156 323/282 |
| 2015/0102672 A1* | 4/2015 | Matsumoto | H02M 1/08 307/31 |
| 2016/0341776 A1* | 11/2016 | Sekine | H02M 1/32 |
| 2018/0212419 A1* | 7/2018 | Yamashita | H02P 29/0241 |

FOREIGN PATENT DOCUMENTS

| WO | WO 2014/017234 A1 | 1/2014 |
|---|---|---|
| WO | WO 2017/057682 A1 | 4/2017 |

OTHER PUBLICATIONS

Japanese-language Written Opinion (PCT/ISA/237) issued in PCT Application No. PCT/JP2017/039686 dated Feb. 20, 2018 (four (4) pages).

* cited by examiner

ON-BOARD CONTROLLER

TECHNICAL FIELD

The present invention relates to an on-board controller to be mounted on a vehicle.

BACKGROUND ART

As an example of an on-board controller to be mounted on a vehicle, there is known a controller for a linear solenoid as a part of an on-board electric load.

The above-described controller for a linear solenoid includes a plurality of ground terminals so as to reduce the frequency of malfunctions due to open faults of a ground terminal.

However, compared with providing a single ground terminal, there is a possibility that a plurality of short faults may occur between each ground terminal and other signal terminals in the case of providing a plurality of ground terminals. In addition, providing a plurality of ground terminals has a problem in that it costs more to connect harness wires to a plurality of grounds. Thus, there is a publicly-known technique for providing a single ground terminal and detecting an open fault of the single ground terminal (disconnection of a ground wire) to appropriately address the fault.

This is because appropriate measures need to be taken in the case where an open fault of a single ground terminal occurs since there is a possibility that internal voltage may be boosted to an abnormal voltage due to formation of a booster circuit.

A technique described in PTL 1 can be cited as a technique for detecting an open fault of a single ground terminal.

The technique described in PTL 1 is as follows. If there occurs an abnormality of disconnection of a ground wire, excitation current flowing through any one of a plurality of induction loads flows back and attenuates via a direct-current power source, a power supply capacitor, and a commutation diode. Then, the power supply capacitor is charged by the back-flow current, the power supply capacitor is charged, and a monitored voltage of the power supply capacitor increases. Thus, when the monitored voltage exceeds a predetermined threshold voltage, it is determined that a disconnection abnormality has occurred, and appropriate measures are taken.

CITATION LIST

Patent Literature

PTL 1: JP 2015-77818 A

SUMMARY OF INVENTION

Technical Problem

However, while it is determined that a disconnection abnormality has occurred when the monitored voltage of the power supply capacitor exceeds the predetermined threshold voltage in the technique described in PTL 1 above, it is conceivable that the monitored voltage may exceed the predetermined threshold voltage due to a temporary voltage abnormality such as a surge voltage. Therefore, there is a possibility that occurrence of disconnection may be erroneously detected even in the case where disconnection of a ground wire has not occurred.

An object of the present invention is to implement an on-board controller including a single ground terminal, which can accurately detect a disconnection fault of a ground wire while avoiding erroneous detection due to a temporary voltage abnormality or current abnormality.

Solution to Problem

In order to achieve the above-described object, the present invention is configured as follows.

Provided is an on-board controller including:

a ground terminal to be connected to a minus terminal of a battery;

a switch element that is supplied with a positive voltage from the battery, and controls an energizing current for a solenoid;

a diode including an anode to be connected to a ground and a cathode to be connected to the switch element;

a current monitoring unit that monitors the energizing current for the solenoid;

a capacitor that is supplied with a positive voltage from the battery, and is connected to the switch element and the ground while being disposed therebetween;

a voltage monitoring unit that measures a positive-side voltage of the capacitor; and a disconnection detection unit that determines whether there has occurred an open fault of the ground terminal to be connected to the minus terminal of the battery, based on a correlation between the current measured by the current monitoring unit and the voltage measured by the voltage monitoring unit.

Advantageous Effects of Invention

According to the present invention, it is possible to implement an on-board controller including a single ground terminal, which can accurately detect a disconnection fault of a ground wire while avoiding erroneous detection due to a temporary voltage abnormality or current abnormality.

DESCRIPTION OF EMBODIMENTS

Embodiments of the present invention will be described below in detail with reference to the drawings.

EMBODIMENTS

First Embodiment

Figure 1:
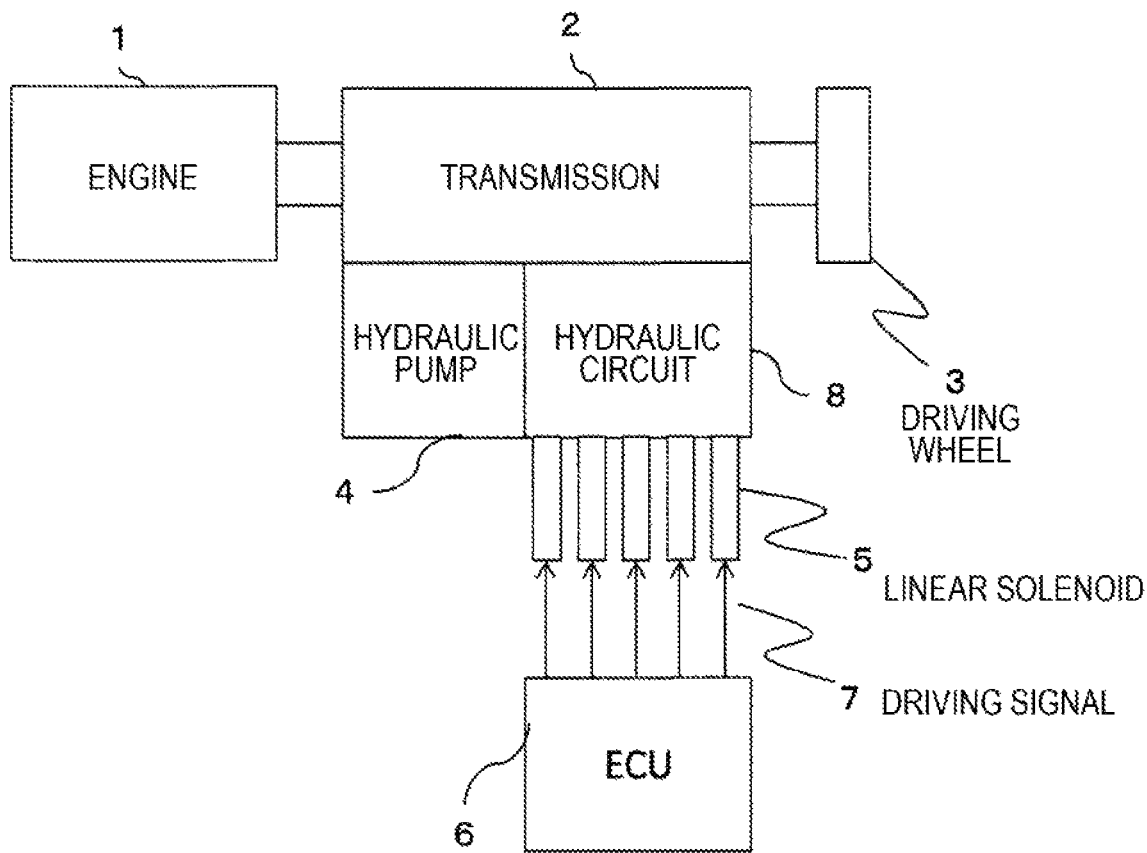
FIG. 1 is a schematic configuration diagram of a vehicular transmission system to which the present invention is, applied.

FIG. 1 is a schematic configuration diagram of a vehicular transmission system to which the present invention is applied.

In FIG. 1, an engine 1 drives a driving wheel 3 via a transmission 2. Operation of the transmission 2 is controlled by a hydraulic circuit 8 to which hydraulic pressure is supplied from a hydraulic pump 4.

In addition, the driving of the hydraulic circuit 8 is controlled by a plurality of linear solenoids 5.

The driving of the linear solenoids 5 is controlled by a driving signal 7 supplied from an electronic contorol unit (ECU) (controller) 6.

Figure 2A:
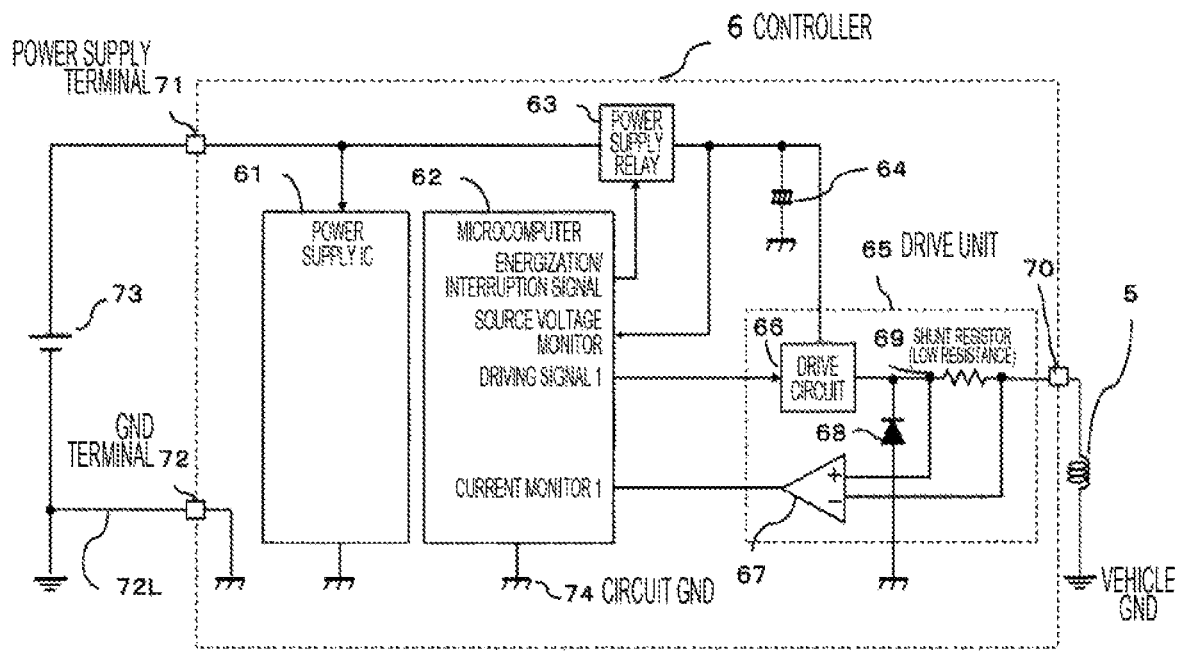
FIG. 2A is an internal configuration diagram of an ECU (controller) shown in FIG. 1.
Figure 2B:
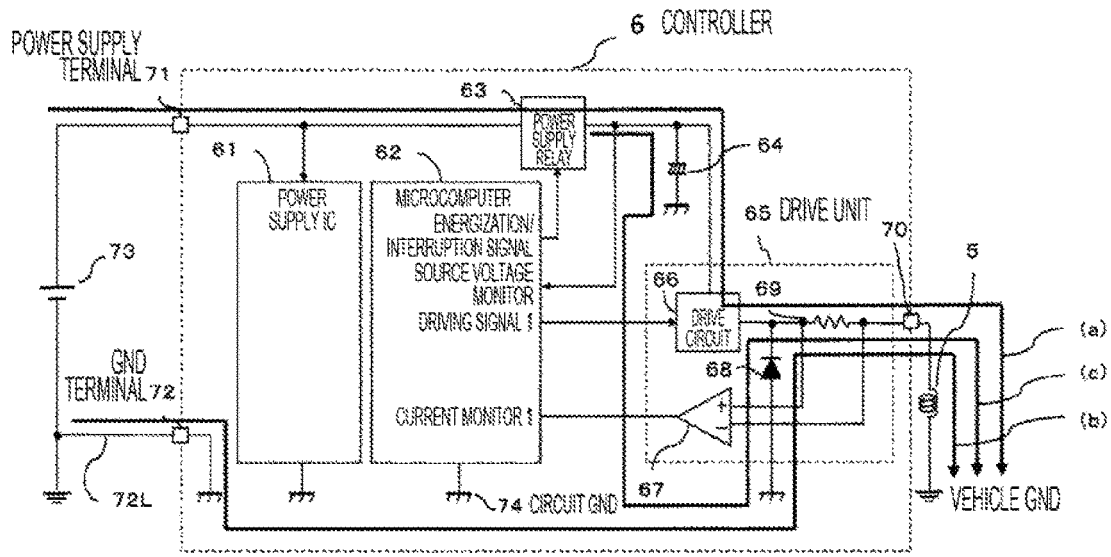
FIG. 2B is a diagram for describing currents flowing through a drive unit 65 inside a controller 6 in a state where a ground terminal 72 of the controller 6 is connected and in a state where the ground terminal 72 is disconnected.

FIG. 2 is an internal configuration diagram of the ECU (controller) 6 shown in FIG. 1.

In FIG. 2, the controller 6 includes a power supply IC 61, a microcomputer 62, a power supply relay 63, a smoothing electrolytic capacitor 64, a drive circuit (switch element) 66, a differential amplifier 67, a regenerative current diode 68, a shunt resistor 69, a power supply terminal 71, a ground terminal 72, and an output terminal 70.

The negative terminal (minus terminal) of a battery 73 disposed outside the controller 6 is connected to a ground. The positive terminal (plus terminal) of the battery 73 is connected to the power supply terminal 71 of the controller 6. Then, the power supply terminal 71 is connected to one end of the smoothing electrolytic capacitor 64 via the power supply relay 63, and is also connected to the drive circuit 66. The other end of the smoothing electrolytic capacitor 64 is connected to a circuit ground. Therefore, the smoothing electrolytic capacitor 64 is connected to the drive circuit (switch element) 66 and a circuit ground 74 while being disposed therebetween.

Voltage is supplied to the power supply IC 61 from the battery 73 via the power supply terminal 71.

The drive circuit 66 is supplied with a positive voltage from the battery 73, and is connected to the output terminal (load terminal) 70 via the cathode of the regenerative current diode 68 and the shunt resistor 69.

The anode of the regenerative current diode 68 is connected to the ground. Furthermore, the output terminal 70 is connected to one end of the linear solenoid 5. The other end of the linear solenoid 5 is connected to a ground of a vehicle.

In addition, one end of the shunt resistor 69, on the drive circuit 66 side, is connected to an input terminal on the positive side of the differential amplifier 67. The other end of the shunt resistor 69, on the output terminal 70 side, is connected to an input terminal on the negative side of the differential amplifier 67. The output terminal of the differential amplifier 67 is connected to a current monitor terminal of the microcomputer 62.

The microcomputer 62 supplies an energization interruption signal to the power supply relay 63 to control interruption of energization of the power supply relay 63. In addition, the microcomputer 62 supplies an ON/OFF signal to the drive circuit 66, so that the drive circuit 66 controls an energizing current for the linear solenoid 5 to drive the linear solenoid 5. Stopping the supply of the ON/OFF signal from the microcomputer 62 causes the drive circuit 66 to stop the driving of the linear solenoid 5.

Furthermore, the microcomputer 62 monitors a voltage (positive-side voltage) at the one end of the smoothing electrolytic capacitor 64, that is, at a terminal of the smoothing electrolytic capacitor 64, connected to the power supply relay 63. In other words, the microcomputer 62 is connected to the circuit ground 74, and monitors a voltage between both ends of the smoothing electrolytic capacitor 64.

Moreover, the negative terminal of the battery 73 is connected to the circuit ground 74 inside the controller 6 via a ground wire 72L and the ground terminal 72.

A drive unit 65 includes the drive circuit 66, the differential amplifier 67, the regenerative current diode 68, and the shunt resistor 69.

Note that although FIG. 2 shows one each of the drive unit 65 and the linear solenoid 5 driven by the drive unit 65, there is a plurality of the linear solenoids 5 and there is also a plurality of the drive units 65 for driving the respective linear solenoids 5, as shown in FIG. 1. For simplicity of illustration, FIG. 2 shows, as representatives, one each of the drive unit 65 and the linear solenoid 5 driven by the drive unit 65.

Here, reference is made to FIG. 2-1 to describe currents flowing through the drive unit 65 inside the controller 6 in a state where the ground terminal 72 of the controller 6 is connected and in a state where the ground terminal 72 is disconnected.

In the case where the ground terminal 72 of the controller 6 is connected, the microcomputer 62 supplies an ON/OFF signal to the drive circuit 66 as described above. While an ON signal is output, current flows to the linear solenoid 5 through a path (a) in FIG. 2-1.

When an OFF signal is output after an ON signal is output, current flows to the linear solenoid 5 through a path (b) in FIG. 2-1. At this time, the voltage between both ends of the smoothing electrolytic capacitor 64 becomes equivalent to the voltage of the battery 73.

In the case where the ground terminal 72 of the controller 6 is disconnected, a booster circuit is formed by the smoothing electrolytic capacitor 64, the drive circuit 66, the regenerative current diode 68, and the linear solenoid 5. When an ON signal of the microcomputer 62 is output, current flows through the same path as the path (a) in FIG. X. Meanwhile, when an OFF signal is output after an ON signal is output, current flows to the linear solenoid 5 through a path (c) in FIG. 2-1. At this time, the voltage between both ends of the smoothing electrolytic capacitor 64 increases due to the current flowing through the path (c). That is, the voltage between both ends of the smoothing electrolytic capacitor 64 increases, depending on the current flowing through the linear solenoid 5.

Figure 3A:
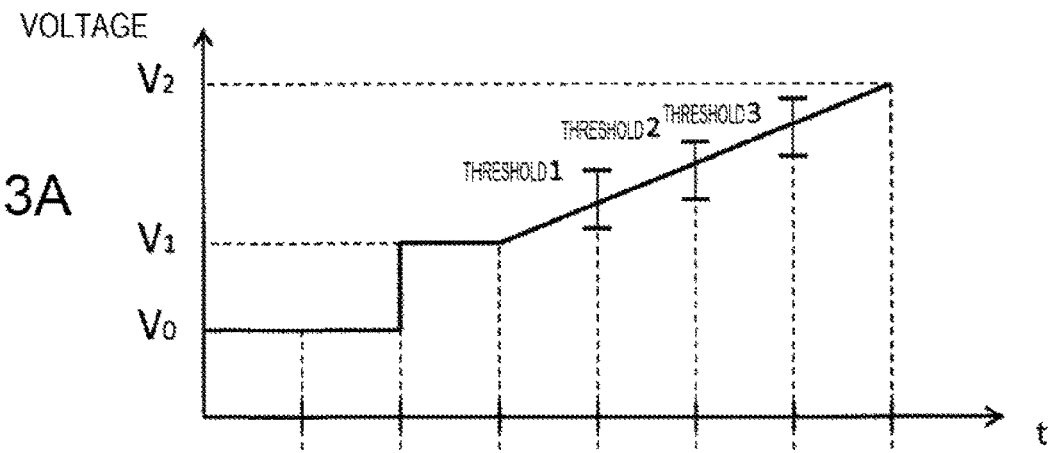
FIGS. 3A and 3B are graphs showing a relationship between a change in current flowing through a shunt resistor and a change in positive-side voltage of a smoothing electrolytic capacitor in the case where a state of a ground wire changes from a state where the ground wire is not disconnected to a state where the ground wire is disconnected.
Figure 3B:
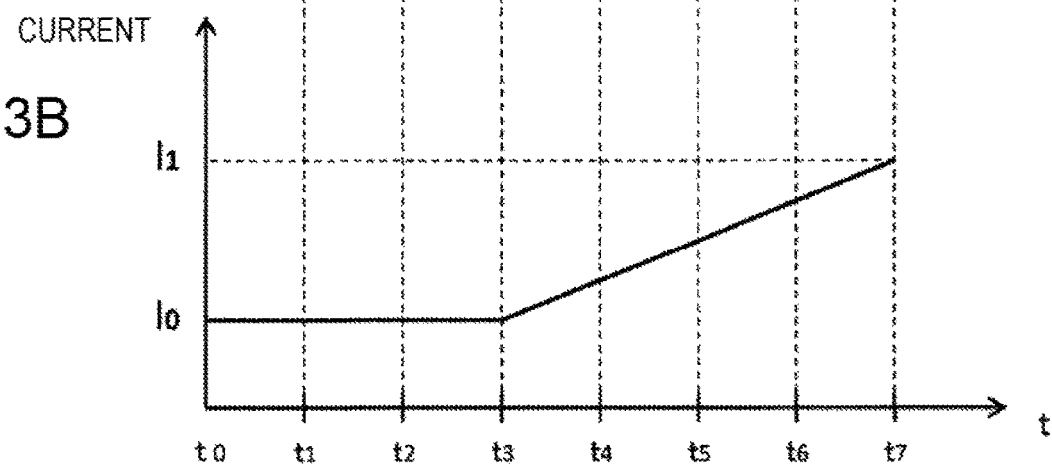

FIG. 3 is a graph showing a correlation between a change in current flowing through the shunt resistor 69, detected by the microcomputer 62, ((b) of FIG. 3) and a change in the voltage between both ends of the smoothing electrolytic capacitor 64 ((a) of FIG. 3) in the case where a state of the ground wire 72L connected to the ground terminal 72 changes from a state where the ground wire 72L is not disconnected to a state where the ground wire 72L is disconnected (open fault). Here, the controller 6 controls current based on an operating state of the transmission system, so as to control the linear solenoid 5.

In FIG. 3, from a time point t0 to a time point t2, during which the ground wire 72L is not disconnected, a voltage is substantially constant at V0, and a current is substantially constant at I0.

In the case where the ground wire 72L is disconnected at the time point t2, the voltage instantaneously increases from V0 to V1 which is a voltage larger than V0. If the current is increased in a gradient manner from a time point t3 after the time point t2 based on a control state of the transmission, the current value reaches I1 at a time point t7. As with the current, the voltage also increases in a gradient manner at the time point t3 after the time point t2, so that the voltage value reaches V2 at the time point t7.

That is, a relationship between the value of a positive-side voltage of the smoothing electrolytic capacitor 64 and the value of a current flowing through the shunt resistor 69 differs between the state where the ground wire 72L is not disconnected and the state where the ground wire 72L is disconnected.

Therefore, an experiment or the like is conducted in advance to find a correlation between the value of a positive-side voltage of the smoothing electrolytic capacitor 64 and the value of a current flowing through the shunt resistor 69 in the state where the ground wire 72L is disconnected. Then, there are created, for example, a formula for calculation of a voltage with a current as a variable, and a correspondence table of a current value and a voltage value. Thus, it is possible to determine that the ground wire 72L has been disconnected if a voltage value calculated (obtained) from a monitored (detected) current value is substantially equal to an actual voltage value monitored.

As described above, there is a possibility that a voltage value obtained from the monitored current may vary from a voltage value obtained through an experiment or the like, depending on actual usage conditions and the like. In addition, there is also a possibility that a surge voltage or surge current may occur. Accordingly, determination is to be made a plurality of times by using a voltage range threshold defined by an upper limit value and a lower limit value as shown in (a) of FIG. 3. In the example shown in (a) of FIG. 3, determination is made based on a threshold 1, a threshold 2, and a threshold 3 consisting of voltage range thresholds consisting of upper and lower limit values. Then, based on results thereof, comprehensive determination is made. The number of times of determination is not limited to three times. It is also possible to set the number of times as twice, or four times or more.

Determination of disconnection is made at regular time intervals. In the case where a voltage value monitored at a time point t4 is within the range of the threshold 1, it is determined that the ground wire 72L has been disconnected (an open fault of the ground terminal 72 has occurred) if a voltage value monitored at a time point t5 is within the range of the threshold 2, and furthermore, a voltage value monitored at a time point t6 is within the range of the threshold 3.

The upper limit value and the lower limit value of the voltage range threshold can be set in consideration of characteristics of an apparatus to be used, usage environment, and the like.

Figure 4:
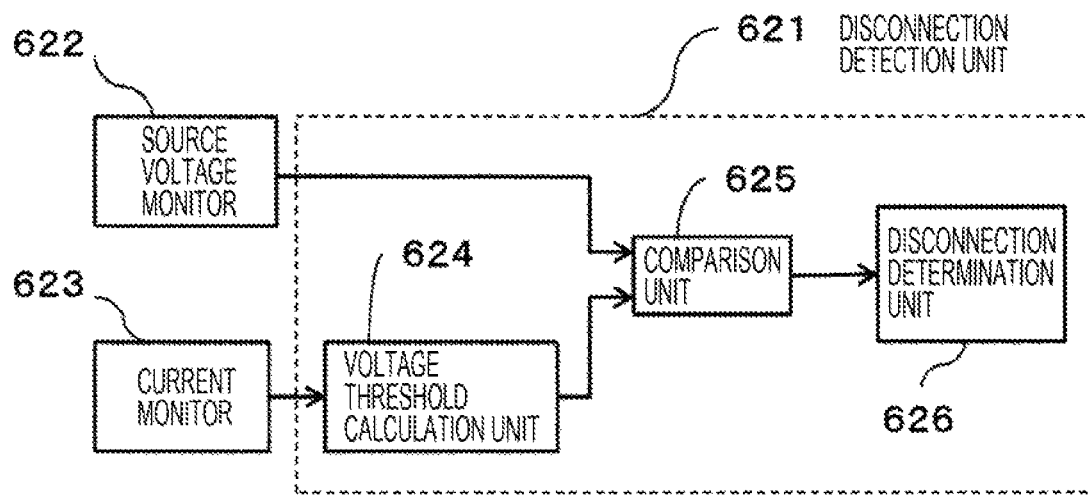
FIG. 4 is a functional block diagram relating to detection of disconnection according to a first embodiment of the present invention.

FIG. 4 is a functional block diagram relating to detection of disconnection of the microcomputer 62 shown in FIG. 2.

In FIG. 4, functional blocks relating to detection of disconnection of the microcomputer 62 include a source voltage monitoring unit 622, a current monitoring unit 623, and a disconnection detection unit 621.

The disconnection detection unit 621 includes a voltage threshold calculation unit 624, a comparison unit 625, and a disconnection determination unit 626.

The source voltage monitoring unit 622 monitors (measures) the above-described positive-side voltage of the smoothing electrolytic capacitor 64, and outputs the monitored voltage value to the comparison unit 625. In addition, the current monitoring unit 623 monitors (measures) a current flowing through the shunt resistor 69, that is, a current flowing through the linear solenoid 5 based on a signal output from the differential amplifier 67 shown in FIG. 2, and outputs the monitored current value to the voltage threshold calculation unit 624.

Based on the current value from the current monitoring unit 623, the voltage threshold calculation unit 624 calculates a voltage threshold (voltage range) by a predetermined calculation formula or the like, and outputs the voltage threshold (voltage range) to the comparison unit 625.

The comparison unit 625 compares the voltage value output from the source voltage monitoring unit 622 with the upper and lower limit values of the voltage threshold (voltage range) output from the voltage threshold calculation unit 624, and determines whether the monitored voltage value is within the voltage threshold. When the voltage value is within the voltage threshold, the comparison unit 625 outputs a signal indicating that effect to the disconnection determination unit 626.

Based on the output signal from the comparison unit 625, the disconnection determination unit 626 determines whether the ground wire 72L has been disconnected, by the above-described determination method.

When the disconnection determination unit 626 determines that the ground wire 72L has been disconnected, the driving signal to be supplied from the microcomputer 62 to the drive circuit 66 is turned off to cause the drive unit 65 to stop the driving of the linear solenoid 5.

As described above, the configuration of the first embodiment of the present invention is as follows. A voltage at the positive electrode of the smoothing electrolytic capacitor 64 is monitored. In addition, a current flowing through the shunt resistor 69 is also monitored. Then, based on the monitored current value, there is calculated a voltage range (voltage threshold) at the positive electrode of the smoothing electrolytic capacitor 64 in the case of disconnection of the ground wire 72L. Thus, it is determined whether the ground wire 72L has been disconnected, by comparing the calculated voltage threshold with the monitored positive-side voltage described above.

Therefore, it is possible to avoid erroneously determining that disconnection of the ground wire 72L has occurred, due to a temporary abnormal voltage or abnormal current such as a surge voltage or surge current. Thus, it is possible to achieve an effect of enabling implementation of an on-board controller capable of accurately detecting a disconnection fault of the ground wire 72L.

Second Embodiment

Next, a second embodiment of the present invention will be described.

In the first embodiment, as shown in FIG. 3, a current flowing through the shunt resistor 69 is monitored, and based on the monitored current value, there is calculated a voltage range (voltage threshold) at the positive electrode of the smoothing electrolytic capacitor 64 in the case of disconnection of the ground wire 72L.

Meanwhile, in the second embodiment, a voltage at the positive electrode of a smoothing electrolytic capacitor 64 is monitored. Based on the monitored voltage value, there is calculated a current range (current threshold) of a current flowing through a shunt resistor 69 in the case of disconnection of a ground wire 72L. Thus, it is determined whether the ground wire 72L has been disconnected, by comparing the calculated current threshold with a monitored current flowing through the shunt resistor 69.

A schematic configuration diagram of a controller according to the second embodiment is similar to that of the example shown in FIG. 2. Thus, illustration and detailed description thereof will be omitted.

In the second embodiment, in the case where a current value monitored at a time point t4 is within the range of a first current threshold in a current waveform shown in (b) of FIG. 3, it is determined that the ground wire 72L has been disconnected if a current value monitored at a time point t5 is within the range of a second current threshold, and furthermore, a current value monitored at a time point t6 is within the range of a third current threshold.

Figure 5:
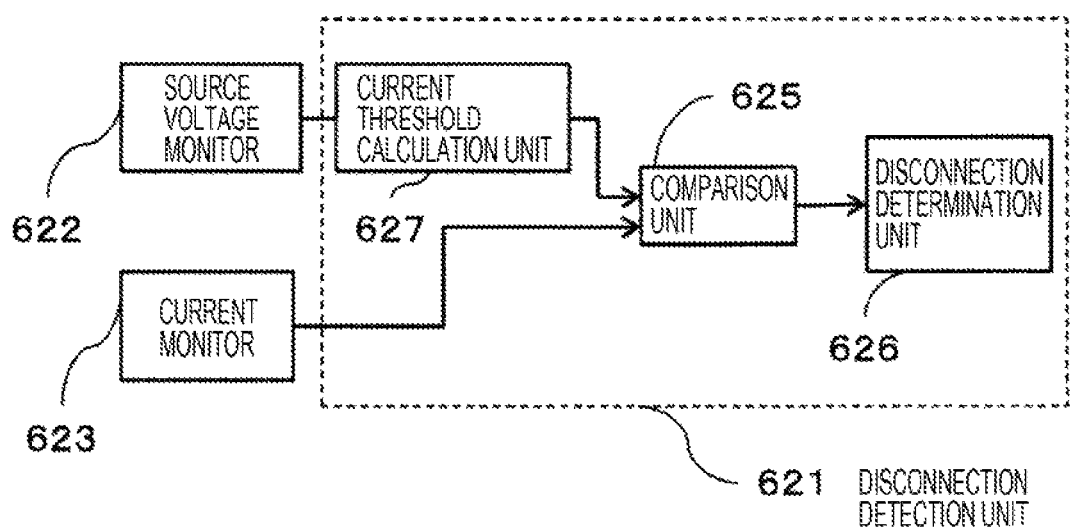
FIG. 5 is a functional block diagram relating to detection of disconnection according to a second embodiment of the present invention.

FIG. 5 is a functional block diagram relating to detection of disconnection of a microcomputer 62 shown in FIG. 2.

The example shown in FIG. 5 differs from the example shown in FIG. 4 in that the voltage threshold calculation unit 624 shown in FIG. 4 has been removed, so that an output value (current value) from a current monitor 623 is output to a comparison unit 625.

Furthermore, a current threshold calculation unit 627 is disposed between a source voltage monitor 622 and the comparison unit 625. Based on a monitored voltage value, the current threshold calculation unit 627 calculates a current range (current threshold) of a current flowing through the shunt resistor 69 in the case of disconnection of the ground wire 72L, and outputs the current range (current threshold) to the comparison unit 625.

The comparison unit 625 compares the current value output from the current monitoring unit 623 with the upper and lower limit values of the voltage threshold (voltage range) output from the current threshold calculation unit 627, and determines whether the monitored current value is within the current threshold. When the current value is within the current threshold, the comparison unit 625 outputs a signal indicating that effect to a disconnection determination unit 626.

Based on the output signal from the comparison unit 625, the disconnection determination unit 626 determines whether the ground wire 72L has been disconnected, by the above-described determination method.

When the disconnection determination unit 626 determines that the ground wire 72L has been disconnected, the driving signal to be supplied from the microcomputer 62 to the drive circuit 66 is turned off to cause the drive unit 65 to stop the driving of the linear solenoid 5.

The second embodiment of the present invention can also achieve an effect similar to that of the first embodiment.

Third Embodiment

Next, a third embodiment of the present invention will be described.

In the third embodiment, it is determined that a ground wire 72L has been disconnected, based on a correlation between a voltage at the positive electrode of a smoothing electrolytic capacitor 64 and a current flowing through a shunt resistor 69 (a current flowing through a linear solenoid 5), as with the first and second embodiments.

In the case where an ON/OFF signal as a driving signal is supplied to a drive circuit 66 of a drive unit 65 while the ground wire 72L is disconnected, there arises a difference between a waveform of the voltage at the positive electrode of the smoothing electrolytic capacitor 64 and a waveform of the current flowing through the shunt resistor 69. The third embodiment focuses on the fact in determination of disconnection of the ground wire 72L.

Figure 6:
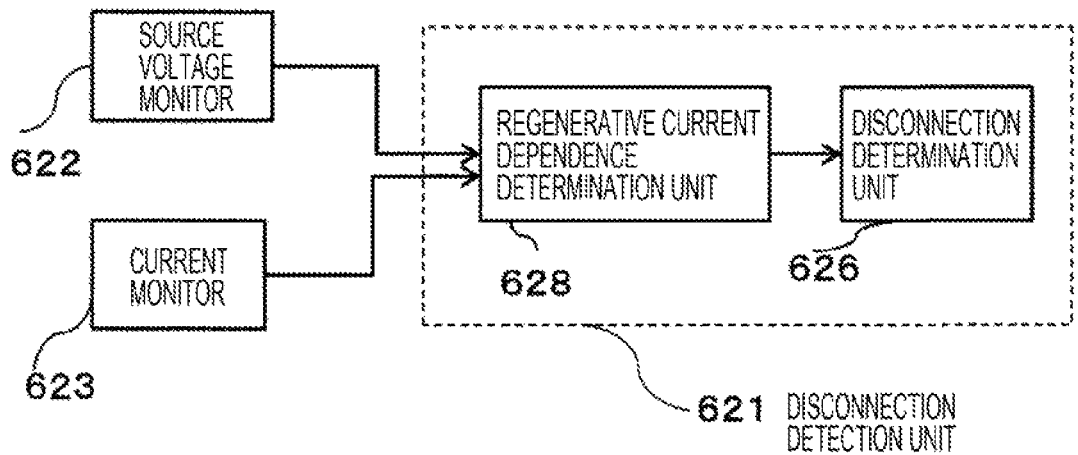
FIG. 6 is a functional block diagram relating to detection of disconnection according to a third embodiment of the present invention.
Figure 7A:
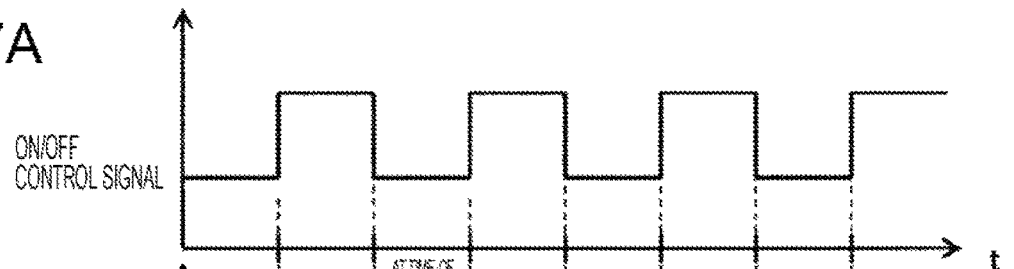
FIGS. 7A to 7E are explanatory diagrams of the principle of detection of disconnection of a pound wire in the third embodiment of the present invention.
Figure 7B:
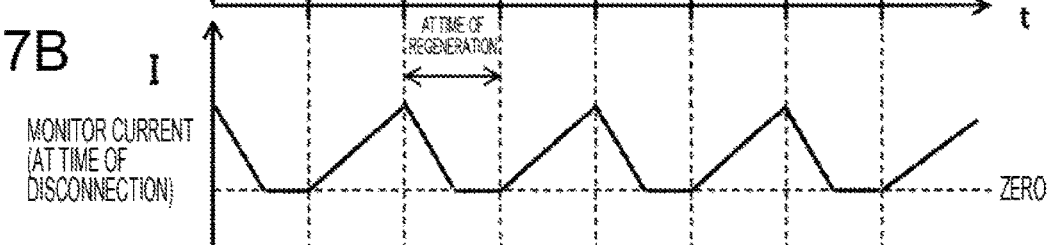
Figure 7C:
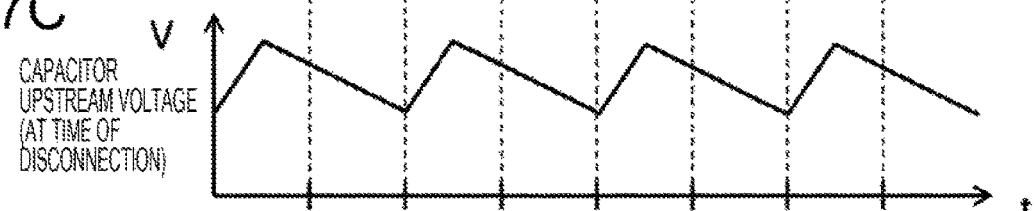
Figure 7D:
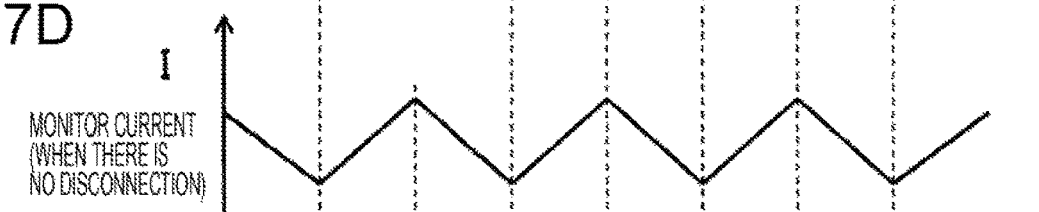
Figure 7E:
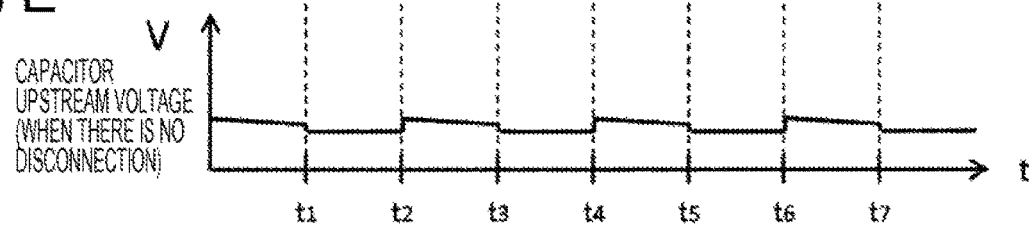

FIG. 6 is a functional block diagram relating to detection of disconnection a microcomputer 62, shown in FIG. 2, according to the third embodiment. FIG. 7 is an explanatory diagram of the principle of detection of disconnection of the ground wire 72L in the third embodiment.

In FIG. 7, (a) of FIG. 7 shows a waveform of a driving signal (ON/OFF control signal) to be supplied to the drive circuit 66, and (b) of FIG. 7 shows a waveform of a current flowing through the shunt resistor 69 in the case of disconnection of the ground wire 72L.

In addition, (c) of FIG. 7 shows a waveform of a voltage at the positive electrode of the smoothing electrolytic capacitor 64 (upstream voltage waveform) in the case of disconnection of the ground wire 72L, (d) of FIG. 7 shows a waveform of a current flowing through the shunt resistor 69 in the case where the ground wire 72L is not disconnected, and (e) of FIG. 7 shows a waveform of a voltage at the positive electrode of the smoothing electrolytic capacitor 64 in the case where the ground wire 72L is not disconnected.

As shown in (e) of FIG. 7, the voltage at the positive electrode of the smoothing electrolytic capacitor 64, in the case where the ground wire 72L is not disconnected, is kept at a substantially constant voltage while pulsation is found, regardless of whether a state of the ON/OFF control signal is ON or OFF.

Meanwhile, as shown in (d) of FIG. 7, the voltage at the positive electrode of the smoothing electrolytic capacitor 64, in the case of disconnection of the ground wire 72L, has a sawtooth waveform. That is, during a period in which an OFF signal of the ON/OFF control signal is output, the voltage temporarily rises, and decreases toward the timing of the rising of the ON/OFF control signal.

Furthermore, as shown in (b) of FIG. 7, the current flowing through the shunt resistor 69, in the case of disconnection of the ground wire 72L, has a sawtooth waveform. That is, the current increases from the timing of the rising of the ON/OFF control signal toward the timing of the falling thereof. Then, the current starts to decrease from the timing of the falling, and decreases temporarily to zero during a period in which an OFF signal of the ON/OFF control signal is output.

A regenerative current is generated in a state where the current decreases from the timing of the falling of an ON/OFF signal toward the timing of the next rising thereof. Opposite to the current waveform, when the regenerative current is generated, the voltage at the positive electrode described above increases from the timing of the falling of the ON/OFF control signal toward the timing of the rising thereof.

Therefore, it is possible to determine whether the ground wire 72L has been disconnected, by comparing a waveform of the current flowing through the shunt resistor 69 with a waveform of the voltage at the positive electrode of the smoothing electrolytic capacitor 64.

However, in order to avoid erroneous determination due to the influence of current or voltage pulsation, a surge voltage, and a surge current, it is to be determined that disconnection has occurred if a relationship between the current waveform and the voltage waveform, in the case of disconnection of the ground wire 72L, consecutively gets into the above-described state where it can be determined that the ground wire 72L has been disconnected, a plurality of times (for example, three consecutive times).

Furthermore, in FIG. 6, a disconnection detection unit 621 according to the third embodiment includes a regenerative current dependence determination unit 628 and a disconnection determination unit 626. A voltage output from a source voltage monitoring unit 622 and a current output from a current monitoring unit 623 are output to the regenerative current dependence determination unit 628. The regenerative current dependence determination unit 628 compares the supplied current waveform with the supplied voltage waveform to determine a dependence relationship as to whether there is seen a relationship in the case of disconnection of the ground wire 72L (predetermined dependence relationship). If the dependence relationship in the case of disconnection of the ground wire 72L is seen, a signal indicating that effect is output to the disconnection determination unit 626.

The disconnection determination unit 626 determines that the ground wire 72L has been disconnected in the case where a signal indicating occurrence of disconnection is consecutively output from the regenerative current dependence determination unit 628 a plurality of times. Then, the disconnection determination unit 626 turns off the driving signal to be supplied from the microcomputer 62 to the drive circuit 66 to cause the drive unit 65 to stop the driving of the linear solenoid 5.

The third embodiment of the present invention can also achieve an effect similar to that of the first embodiment.

Fourth Embodiment

Next, a fourth embodiment of the present invention will be described.

As described above, the linear solenoid 5 includes a plurality of solenoids, and there is also a plurality of the drive units 65 for driving the respective solenoids. Therefore, in the first to third embodiments, when the disconnection detection unit 621 determines that disconnection of the ground wire 72L has occurred, it is possible to instruct the plurality of drive units 65 to simultaneously stop the driving of the respective linear solenoids 5 (energization of the linear solenoids 5), or to sequentially stop the driving thereof in predetermined order of priority.

The fourth embodiment of the present invention is an example of giving an instruction for sequentially stopping the driving of a plurality of linear solenoids 5 in predetermined order of priority. This is performed by a disconnection determination unit 626 according to each embodiment.

Figure 8:
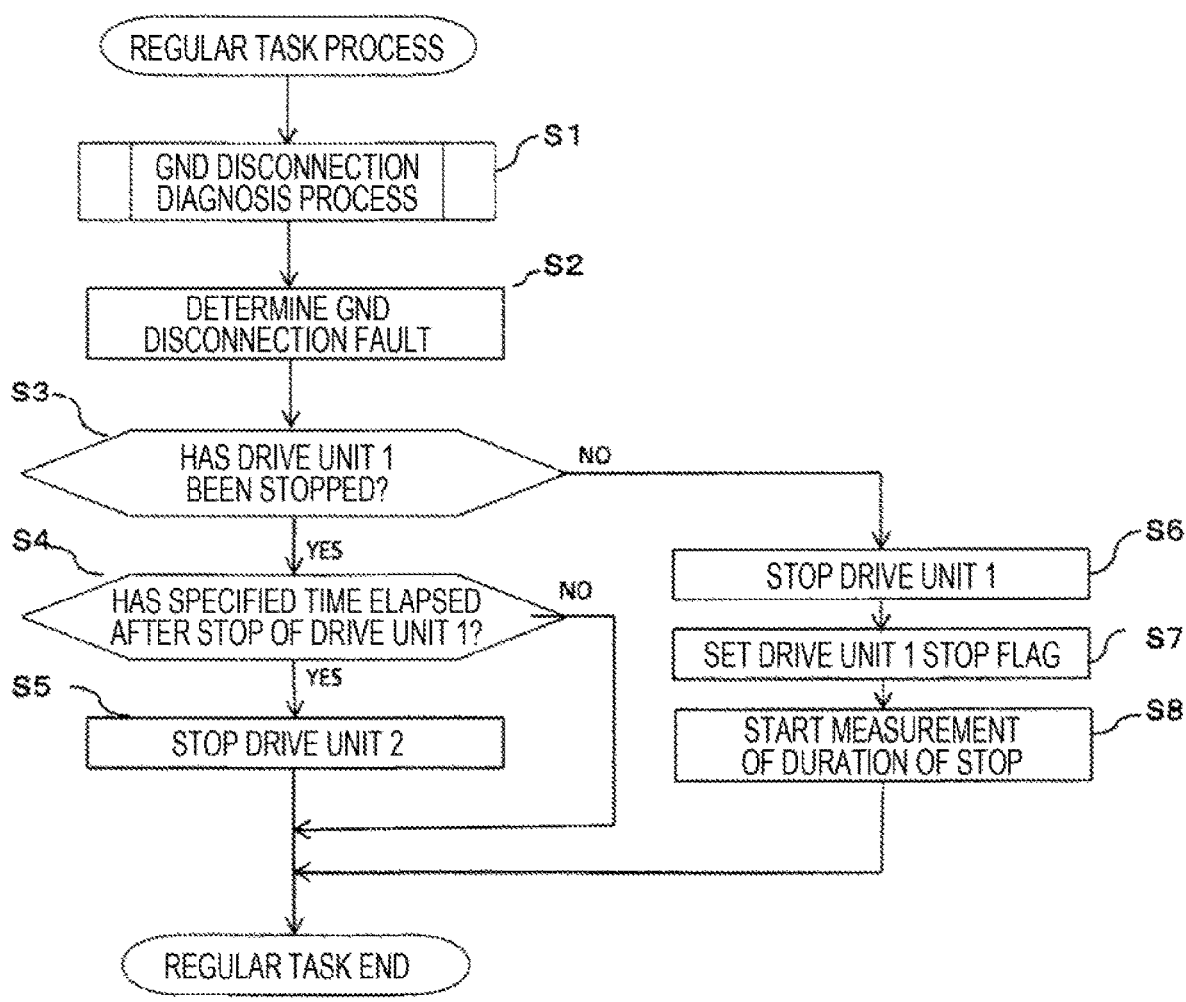
FIG. 8 is a flowchart of operation in a fourth embodiment of the present invention.

FIG. 8 is a flowchart of operation in the fourth embodiment.

Note that the case in which there are two drive units, that is, a drive unit 1 and a drive unit 2, is taken as an example in FIG. 8. A similar process can also be performed even when there are three or more drive units.

In FIG. 8, a process of determination (diagnosis) of disconnection of a ground wire 72L is performed (step S1), and it is determined that a disconnection fault has occurred (step S2).

Next, it is determined whether the drive unit 1 has been stopped (step S3). If the drive unit 1 has not been stopped, the drive unit 1 is stopped (step S6), a drive unit 1 stop flag is set (step S7), and duration for which the drive unit 1 is stopped starts to be measured (step S8).

If, in step S3, the drive unit 1 has been stopped, it is determined whether specified time has elapsed after the stop of the drive unit 1 (step S4). If the specified time has elapsed, the drive unit 2 is stopped (step S5).

As described above, the fourth embodiment of the present invention can also achieve an effect similar to the effects of the first to third embodiments. In addition, it is possible to sequentially stop operation of the plurality of linear solenoids 5 in predetermined order when disconnection of the ground wire 72L occurs. This achieves an effect of allowing the driving of the linear solenoid 5 having high priority in the order of break, to be stopped early according to fail-safe operation of a transmission system upon occurrence of disconnection of the ground wire 72L.

Note that a controller for a CVT can be cited as an example of an on-board controller to which the present invention is applied. In this case, a primary pulley, a secondary pulley, and the like are to be driven by the plurality of linear solenoids 5.

The first to fourth embodiments each describe the ECU 6 for a vehicular automatic transmission. Meanwhile, the present invention is not limited to the vehicular automatic transmission, but can achieve an effect similar to that of the present invention even in the case where the present invention is applied to a vehicular controller (for example, an engine controller) with a similar circuit configuration for driving an electromagnetic induction load.

REFERENCE SIGNS LIST 1 engine
2 transmission
3 driving wheel
4 hydraulic pump
5 linear solenoid
6 ECU (controller)
61 power supply IC
62 microcomputer
63 relay
64 smoothing electrolytic capacitor
65 drive unit
66 drive circuit (switch element)
67 differential amplifier
68 regenerative current diode
69 shunt resistor
70 output terminal
71 power supply terminal
72 ground terminal
72L ground wire
73 battery
621 disconnection detection unit
622 source voltage monitoring unit
623 current monitoring unit
624 voltage threshold calculation unit
625 comparison unit
626 disconnection determination unit
627 current threshold calculation unit
628 regenerative current dependence determination unit

The invention claimed is:

1. An on-board controller comprising:
a ground terminal to be connected to a minus terminal of a battery;
a switch element that is supplied with a positive voltage from the battery, and controls an energizing current for a solenoid;

a diode including an anode to be connected to a around and a cathode to be connected to the switch element;

a current monitoring unit that measures, the energizing current for the solenoid;

a capacitor that is supplied with a positive voltage from the battery, and is connected to the switch element and the ground while being disposed therebetween;

a voltage monitoring unit that measures a positive-side voltage of the capacitor; and a disconnection detection unit that determines whether there has occurred an open fault of the ground terminal to be connected to the minus terminal of the battery, based on a correlation between the energizing current measured by the current monitoring unit and the voltage measured by the voltage monitoring unit.

2. The on-board controller according to claim 1, wherein the disconnection detection unit includes:

a voltage threshold calculation unit that calculates a voltage range of the positive-side voltage of the capacitor in a case of an open fault of the ground terminal, based on the current measured by the current monitoring unit, and treats the voltage range as a voltage threshold; and a disconnection determination unit that determines whether an open fault of the ground terminal has occurred, based on whether the positive-side voltage measured by the voltage monitoring unit is within the voltage threshold calculated by the voltage threshold calculation unit.

3. The on-board controller according to claim 2, wherein the disconnection determination unit determines that an open fault of the ground terminal has occurred when it is determined, a plurality of times, that the positive-side voltage is within the voltage threshold calculated by the voltage threshold calculation unit.

4. The on-board controller according to claim 1, wherein the disconnection detection unit includes:

a current threshold calculation unit that calculates an energizing current range of the solenoid in a case of an open fault of the around terminal, based on the voltage measured by the voltage monitoring unit, and treats the energizing current range as a current threshold; and a disconnection determination unit that determines whether an open fault of the ground terminal has occurred, based on whether the energizing current measured by the current monitoring unit is within the current threshold calculated by the current threshold calculation unit.

5. The on-board controller according to claim 4, wherein the disconnection determination unit determines that an open fault of the ground terminal has occurred when it is determined, a plurality of times, that the measured energizing current is within the current threshold calculated by the current threshold calculation unit.

6. The on-board controller according to claim 1, wherein the disconnection detection unit includes:

a regenerative current dependence determination unit that determines whether a waveform of the voltage and a waveform of the energizing current, to be generated in a case of an open fault of the ground terminal, have a predetermined dependence relationship, based on a correlation between a waveform of the voltage measured by the voltage monitoring unit and a waveform of the energizing current measured by the current monitoring unit; and a disconnection determination unit that determines whether an open fault of the ground terminal has occurred, based on determination, made by the regenerative current dependence determination unit, as to whether the waveform of the voltage and the waveform of the energizing current have the predetermined dependence relationship.

7. The on-board controller according to claim 6, wherein the disconnection determination unit determines that an open fault of the ground terminal has occurred when it is determined, a plurality of times, that the waveform of the voltage and the waveform of the energizing current have the predetermined dependence relationship.

8. The on-board controller according to claim 1, wherein the solenoid includes a plurality of solenoids, and the disconnection determination unit causes energization of the plurality of solenoids to be sequentially stopped in predetermined order of priority when it is determined whether an open fault of the ground terminal has occurred.

9. The on-board controller according to claim 1, wherein the solenoid includes a plurality of solenoids, and the disconnection determination unit causes energization of the plurality of solenoids to be simultaneously stopped when it is determined whether an open fault of the ground terminal has occurred.

* * * * *